United States Patent
Meng et al.

(10) Patent No.: US 10,964,547 B2
(45) Date of Patent: *Mar. 30, 2021

(54) METHOD OF FABRICATING SEMICONDUCTOR STRUCTURE

(71) Applicant: Taiwan Semiconductor Manufacturing Co., Ltd., Hsinchu (TW)

(72) Inventors: Chin-Han Meng, Hsinchu (TW); Chih-Hsien Hsu, Hsinchu (TW); Jr-Sheng Chen, Hsinchu (TW); An-Chi Li, Hsinchu County (TW); Lin-Ching Huang, Hsinchu (TW); Yu-Pei Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/693,389

(22) Filed: Nov. 25, 2019

(65) Prior Publication Data

US 2020/0098583 A1  Mar. 26, 2020

Related U.S. Application Data

(63) Continuation of application No. 16/175,750, filed on Oct. 30, 2018, now Pat. No. 10,529,578.

(Continued)

(51) Int. Cl.
*H01L 21/3065* (2006.01)
*B81C 1/00* (2006.01)
(Continued)

(52) U.S. Cl.
CPC .... *H01L 21/30655* (2013.01); *B81C 1/00531* (2013.01); *B81C 1/00619* (2013.01);
(Continued)

(58) Field of Classification Search
None
See application file for complete search history.

(56) References Cited

U.S. PATENT DOCUMENTS 10,121,640 B2   11/2018   Muto et al.
10,529,578 B2 *  1/2020   Meng ................. H01L 21/3083
(Continued)

OTHER PUBLICATIONS

Notice of Allowance dated Sep. 20, 2019 in connection with U.S. Appl. No. 16/175,750.

*Primary Examiner* — Jiong-Ping Lu
(74) *Attorney, Agent, or Firm* — Eschweiler & Potashnik, LLC (57) ABSTRACT

A method of fabricating a semiconductor structure including the following steps is provided. A mask layer is formed on a semiconductor substrate. The semiconductor substrate revealed by the mask layer is anisotropically etched until a cavity is formed in the semiconductor substrate, wherein anisotropically etching the semiconductor substrate revealed by the mask layer comprises performing a plurality of first cycles and performing a plurality of second cycles after performing the first cycles, each cycle among the first and second cycles respectively includes performing a passivating step and performing an etching step after performing the passivating step. During the first cycles, a first duration ratio of the etching step to the passivating step is variable and ramps up step by step. During the second cycles, a second duration ratio of the etching step to the passivating step is constant, and the first duration ratio is less than the second duration ratio.

20 Claims, 8 Drawing Sheets

Related U.S. Application Data (60) Provisional application No. 62/584,896, filed on Nov. 12, 2017.

(51) Int. Cl.
    *H01L 21/308*     (2006.01)
    *H01L 21/311*     (2006.01)

(52) U.S. Cl.
    CPC ...... *H01L 21/3065* (2013.01); *H01L 21/3081* (2013.01); *H01L 21/3083* (2013.01); *H01L 21/31116* (2013.01); *H01L 21/31144* (2013.01); *B81C 2201/0112* (2013.01); *B81C 2201/0132* (2013.01)

(56) References Cited

U.S. PATENT DOCUMENTS

| | | | |
|---|---|---|---|
| 2005/0136682 A1 | 6/2005 | Hudson et al. | |
| 2007/0004215 A1 | 1/2007 | Mrvos et al. | |
| 2007/0015371 A1* | 1/2007 | Olynick | H01L 21/30655 438/712 |
| 2011/0097903 A1* | 4/2011 | Nozawa | B81C 1/00626 438/714 |
| 2011/0108861 A1 | 5/2011 | Smith et al. | |
| 2011/0244687 A1* | 10/2011 | Oohara | H01J 37/32972 438/694 |
| 2012/0171869 A1 | 7/2012 | Morikawa et al. | |
| 2015/0011088 A1 | 1/2015 | McNie et al. | |
| 2015/0126033 A1 | 5/2015 | LeFevre et al. | |
| 2015/0255301 A1 | 9/2015 | Park et al. | |
| 2017/0316976 A1 | 11/2017 | Koppitsch et al. | |

* cited by examiner

METHOD OF FABRICATING SEMICONDUCTOR STRUCTURE

CROSS-REFERENCE TO RELATED APPLICATION

This is a continuation application of and claims the priority benefit of U.S. application Ser. No. 16/175,750, filed on Oct. 30, 2018, now allowed, patented on Jan. 7, 2020 as U.S. Pat. No. 10,529,578, which claims the priority benefit of U.S. provisional application Ser. No. 62/584,896, filed on Nov. 12, 2017. The entirety of each of the above-mentioned patent applications is hereby incorporated by reference herein and made a part of this specification.

BACKGROUND

To fabricate openings, trenches or cavities with high aspect ratio in semiconductor substrates, Bosch process is commonly used. The current Bosch process suffers poor etching uniformity and poor etching profile control when deep etching is performed in the semiconductor substrates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
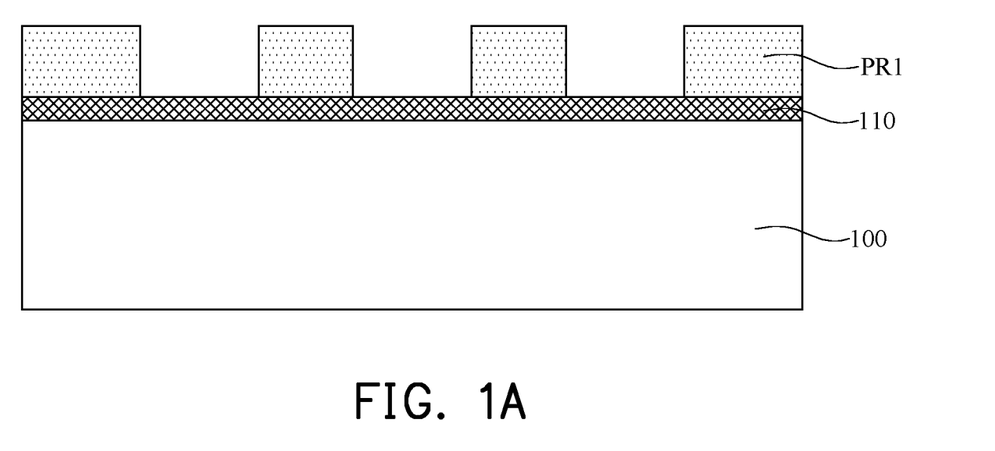
FIG. 1A through FIG. 1C schematically illustrate cross-sectional views of a method of fabricating a semiconductor structure according to some embodiments of the present disclosure.
Figure 1B:
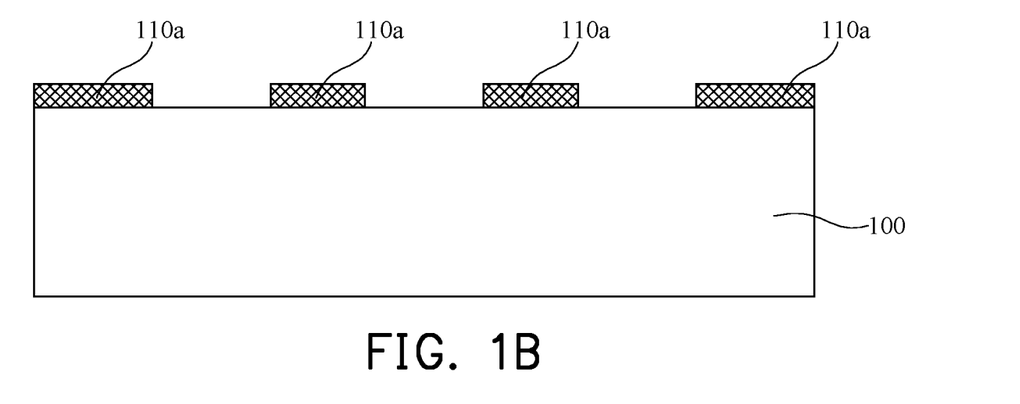
Figure 1C:
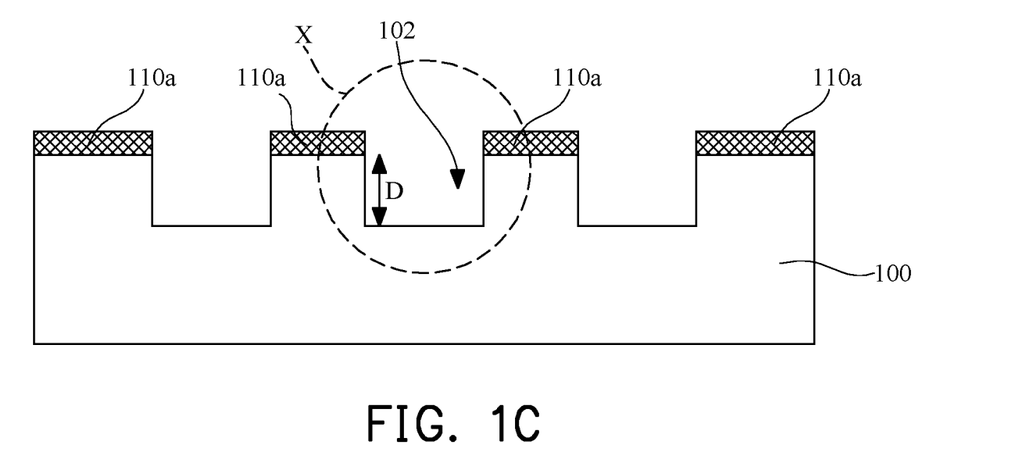

FIG. 1A through FIG. 1C schematically illustrate cross-sectional views of a method of fabricating a semiconductor structure according to some embodiments of the present disclosure.

Referring to FIG. 1A, a semiconductor substrate 100 is provided and a mask material layer 110 on the semiconductor substrate 100. For example, the semiconductor substrate 100 may include a silicon substrate or substrates made of other semiconductor materials. After forming the mask material layer 110 on the semiconductor substrate 100, a photolithography process, for example, is performed such that a patterned photoresist layer PR1 is formed on the mask material layer 110. The patterned photoresist layer PR1 may include at least one or a plurality of openings for exposing or revealing the mask material layer 110 partially. In some embodiments, the mask material layer 110 may include silicon dioxide or other materials having high etching selectivity with respect to the material of the semiconductor substrate 100 (e.g. silicon).

Referring to FIG. 1A and FIG. 1B, by utilizing the patterned photoresist layer PR1 as a mask, the mask material layer 110 revealed or not covered by the patterned photoresist layer PR1 may be removed until the semiconductor substrate 100 is exposed such that a mask layer 110a having predetermined pattern is formed on the semiconductor substrate 100. In some embodiments, the mask material layer 110 may be patterned through an etching process. After forming the mask layer 110a, the patterned photoresist layer PR1 is stripped.

Referring to FIG. 1C, a multi-step anisotropic etching process is performed to form a cavity 102 in the semiconductor substrate 100. By utilizing the mask layer 110a as an etching mask, the semiconductor substrate 100 revealed by the mask layer 110a is anisotropically etched until the cavity 102 having a predetermined depth D is formed. In some embodiments, the depth D of the cavity 102 may range from about 15 micrometers to about 25 micrometers. However, the depth D of the cavity 102 is not limited.

The multi-step etching process is described in accompany with FIG. 2, FIG. 3A through FIG. 3C and FIG. 4A through FIG. 4E in detail.

Figure 2:
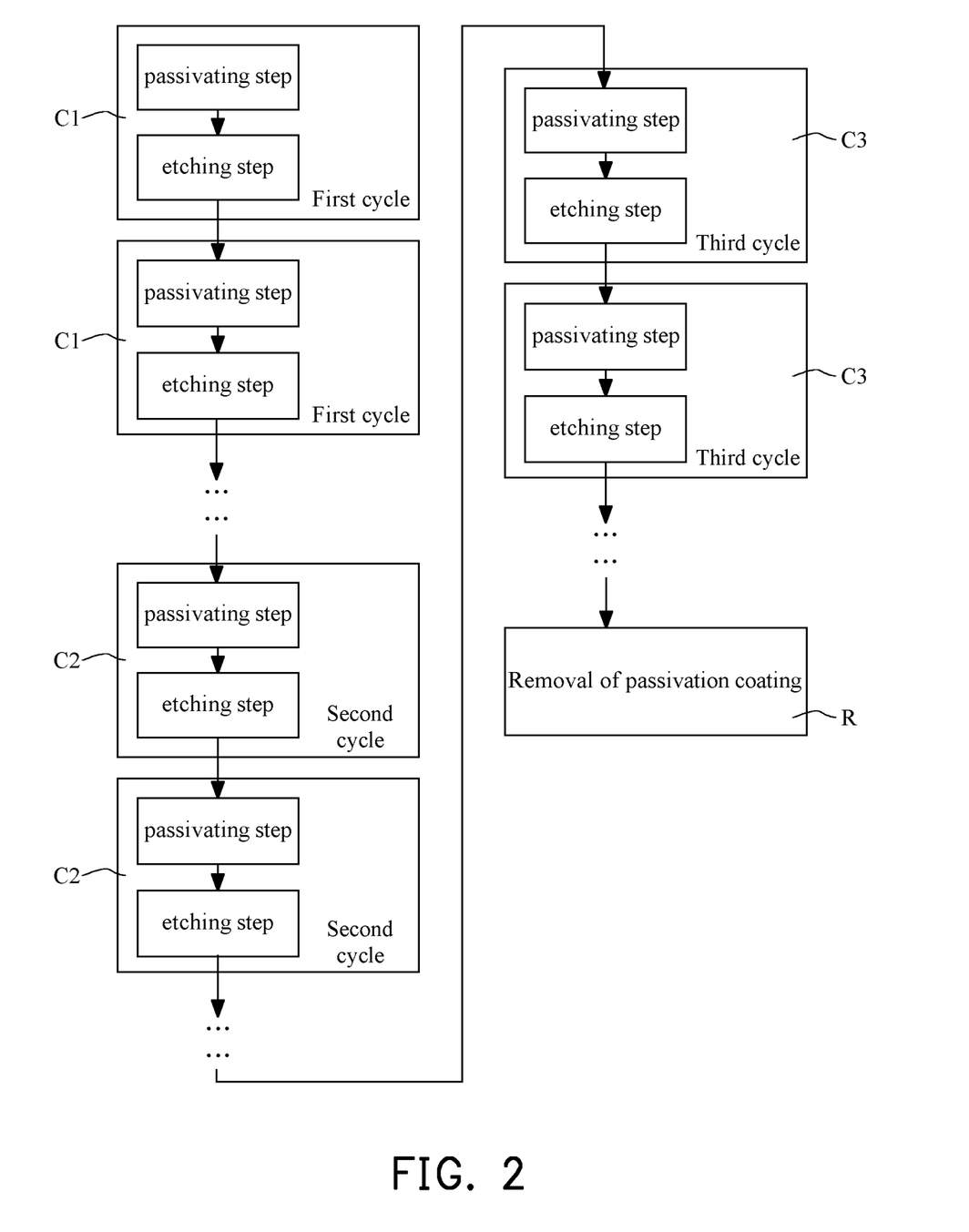
FIG. 2 is a flow chart schematically illustrating a method of fabricating the cavity according to some embodiments of the present disclosure.
Figure 3A:
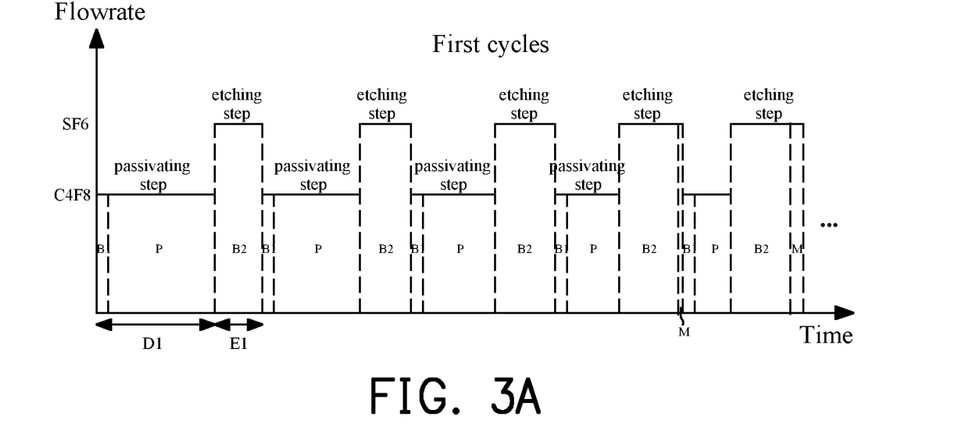
FIG. 3A, FIG. 3B and FIG. 3C are diagrams respectively illustrating the etching steps and the passivating steps of the first cycles, the second cycles and the third cycles according to some embodiments of the present disclosure.
Figure 3B:
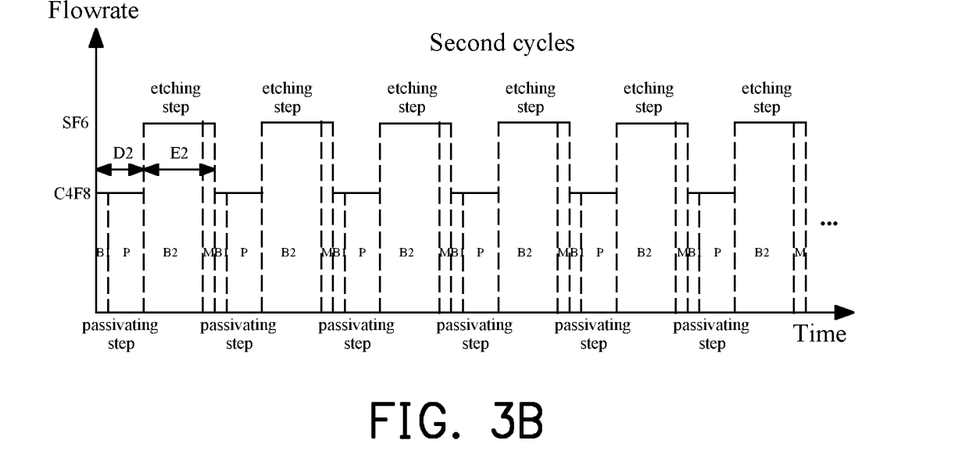
Figure 3C:
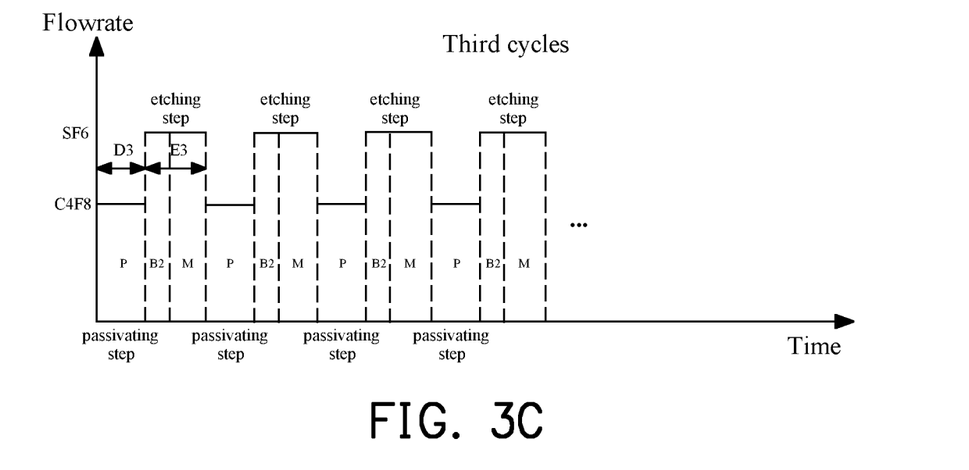

FIG. 2 is a flow chart schematically illustrating a method of fabricating the cavity according to some embodiments of the present disclosure. FIG. 3A, FIG. 3B and FIG. 3C are diagrams respectively illustrating the etching steps and the passivating steps of the first cycles, the second cycles and the third cycles according to some embodiments of the present disclosure. FIG. 4A through FIG. 4E schematically illustrate cross-sectional view of a method of fabricating the cavity 102 shown in X portion of FIG. 1C according to some embodiments of the present disclosure.

Referring to FIG. 2, the multi-step anisotropic etching process mentioned above may include performing a plurality of first cycles C1 and performing a plurality of second cycles C2, and the second cycles C2 are performed repeatedly after the first cycles C1. The above-mentioned first and second cycles C1 and C2 are performed in a reactive chamber suitable for generating plasma for anisotropic etching. Each one cycle among the first cycles C1 and the second cycles C2 may respectively include a passivating step and an etching step performed after the passivating step. After performing the first cycles C1 and the second cycles C2, a passivation coating may remain on sidewalls of the cavity and a removal process R may be performed to remove the passivation coating formed on the sidewalls of the cavity. For example, the first cycles C1 may be performed repeatedly n1 times and the second cycles C2 may be performed repeatedly n2 times. For example, n1 may be an integer ranging from 2 to 4; and n2 may be an integer ranging from 2 to 4. The value of n1 and n2 depends on the depth D of the cavity.

In some alternative embodiments, the multi-step anisotropic etching process may further include a plurality of third cycles C3 performed repeatedly after the second cycles C2. The above-mentioned first, second and third cycles C1, C2 and C3 are performed in a reactive chamber suitable for generating plasma for anisotropic etching. Each one cycle among the first cycles C1, the second cycles C2 and the third cycles C3 may respectively include a passivating step and an etching step performed after the passivating step. After performing the first cycles C1, the second cycles C2 and the third cycles C3, a passivation coating may remain on sidewalls of the cavity and a removal process R may be performed to remove the passivation coating formed on the sidewalls of the cavity. For example, the first cycles C1 may be performed repeatedly n1 times, the second cycles C2 may be performed repeatedly n2 times, and the third cycles C3 may be performed n3 times. For example, n1 may be an integer ranging from 2 to 4; n2 may be an integer ranging from 2 to 4; and n3 may be an integer ranging from 2 to 4. The value of n1, n2 and n3 depends on the depth D of the cavity.

Figure 4A:
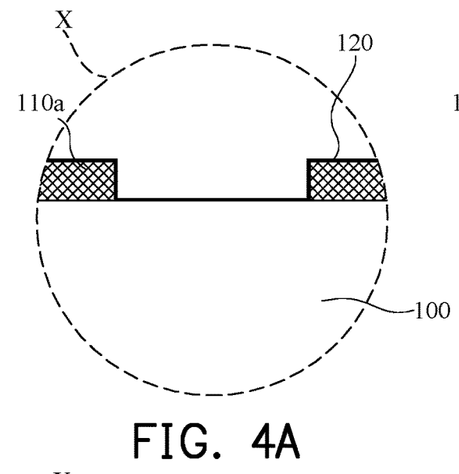
FIG. 4A through FIG. 4E schematically illustrate cross-sectional view of a method of fabricating the cavity shown in X portion of FIG. 1C according to some embodiments of the present disclosure.

Referring to FIG. 2, FIG. 3A and FIG. 4A, a pre-coating process is performed on the semiconductor substrate 100 and the mask layer 110a by the first cycles C1 such that a passivation coating 120 is conformally formed on the mask layer 110a and the semiconductor substrate 100. Since the passivation coating 120 is formed by the first cycles C1, the first cycles C1 are pre-coating cycles. During the first cycles C1, the duration E1 of the etching step is variable and ramps up step by step, the duration D1 of the passivating step is variable and ramps down step by step, and a first duration ratio E1/D1 of the etching step to the passivating step is variable and ramps up step by step. In some embodiments, during the first cycles C1 (i.e. the pre-coating cycles), the duration E1 of the etching step linearly ramps up step by step, the duration D1 of the passivating step linearly ramps down step by step, and the first duration ratio E1/D1 non-linearly ramps up step by step. The first duration ratio E1/D1 is variable and may ramp up step by step from X1 to Y1, wherein X1 is less than 1 (e.g. about 0.4), and Y1 is greater than 1 and less than 1.5.

As shown in FIG. 3A, during the passivating step of each first cycle C1, passivating gas (e.g. $C_4F_8$ or other suitable passivating gas) is introduced into the reactive chamber and the flowrate of the passivating gas may range from about 200 sccm to about 300 sccm. In some embodiments, during the passivating step of each first cycle C1, passivating gas is introduced into the reactive chamber and the flowrate of the passivating gas is about 250 sccm. During the etching step of each first cycle C1, etching gas (e.g. $SF_6$ or other suitable etching gas) is introduced into the reactive chamber and the flowrate of the etching gas may range from about 350 sccm to about 450 sccm. During the etching step of each first cycle C1, etching gas is introduced into the reactive chamber and the flowrate of the passivating gas is about 400 sccm, for example. In other words, the passivating gas and the etching gas are alternately introduced into the reactive chamber when performing the first cycles C1. In some embodiments, the passivating step of each first cycle C1 may include a boosting B1 followed by a passivating P, wherein the duration of the boosting B1 ranges from about 0.3 second to about 0.7 second (e.g., about 0.5 second), the process pressure applied to the reactive chamber during the boosting B1 from about 35 Torr to about 45 Torr (e.g., about 40 Torr), the duration of the passivating P linearly ramps down step by step from about 5 seconds to about 2 seconds, and the process pressure applied to the reactive chamber during the passivating P ranges from about 75 Torr to about 85 Torr (e.g., about 80 Torr).

In some embodiments, during the foremost cycles (e.g., the first three cycles) among the first cycles C1, each etching step may respectively include a boosting B2 only, and the duration of the boosting B2 may be variable and may ramp up from about 2 seconds to about 2.5 seconds step by step. The boosting B2 may be used to at least partially remove portions of the passivation coating 120 that are formed on top surfaces of the semiconductor substrate 100 and the mask layer 110a, and portions of the passivation coating 120 formed on sidewalls the mask layer 110a are not removed by the boosting B2. For example, during the boosting B2 of the first cycles C1, ion bombardment provided by the plasma generated in the reactive chamber is used to remove the portions of the passivation coating 120 formed on top surfaces of the semiconductor substrate 100 and the mask layer 110a. The portions of the passivation coating 120 formed on sidewalls the mask layer 110a are not removed by ion bombardment provided by the plasma. After performing the foremost steps (e.g., the first three steps) among the first cycles C1, the semiconductor substrate 100 may not be etched due to the protection of the pre-coating (i.e. the passivation coating 120). The boosting B1 of each first cycle C1 is a pre-treatment performed before the passivating P, the passivation coating 120 is deposited by the passivating P of the first cycles C1, and the boosting B2 of each first cycle C1 is performed to remove the passivation coating 120 partially.

Figure 4B:
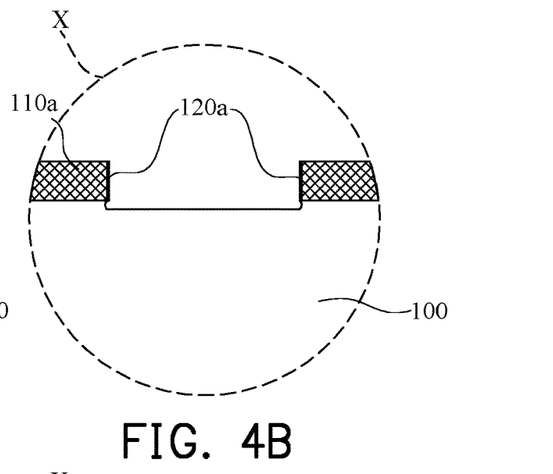

Referring to FIG. 3A and FIG. 4B, during the rest steps (e.g., the fourth and the fifth steps) among the first cycles C1, each etching step may respectively include a boosting B2 followed by a main etching M. The duration of the boosting B2 may be constant which ranges from about 2 seconds to about 3 seconds (e.g., about 2.5 seconds), the process pressure applied to the reactive chamber during the boosting B2 may range about 20 Torr to about 30 Torr (e.g., about 25 Torr), the duration of the main etching M may be variable and linearly ramps up step by step, and the process pressure applied to the reactive chamber during the main etching M may range from about 75 Torr to about 85 Torr (e.g., about 80 Torr). As shown in FIG. 3A, after performing the rest steps (e.g., the fourth and the fifth steps) among the first cycles C1, the portions of the passivation coating 120 formed on top surfaces of the semiconductor substrate 100 and the mask layer 110a may be removed and a passivation coating 120a is formed the on sidewalls the mask layer 110a. As shown in FIG. 4B, after performing the rest steps (e.g., the fourth and the fifth steps) among the first cycles C1, the semiconductor substrate 100 may be slightly etched and a recess S1 is formed in the substrate 100.

In some embodiments, during the boosting B2 of each etching step in the first cycles C1, oxygen gas ($O_2$) may be further introduced into the reactive chamber and the flowrate of the oxygen gas may range from about 45 sccm to about 55 sccm (e.g., about 50 sccm). Furthermore, during the main etching M of each etching step in the first cycles C1, oxygen gas may be further introduced into the reactive chamber and the flowrate of the oxygen gas may range from about 0.5 sccm to about 1.5 sccm (e.g., about 1 sccm).

When performing the passivating steps of the first cycles C1, the coil radio frequency (RF) power applied to the coil (i.e. upper electrode) of the reactive chamber ranges from about 1800 Watts to about 2200 Watts (e.g., about 2000 Watts). When performing the etching steps of the first cycles C1, the coil RF power applied to the coil of the reactive chamber ranges from about 2300 Watts to about 2700 Watts (e.g., about 2500 Watts), the platen RF power applied to the platen (i.e. lower electrode) of the reactive chamber ranges from about 100 Watts to about 150 Watts (e.g., about 125 Watts) during the boosting B2, and the platen RF power applied to the platen (i.e. lower electrode) of the reactive chamber ranges from about 15 Watts to about 25 Watts (e.g., about 20 Watts) during the main etching M. Furthermore, the platen may operate at high frequency ranging from 10 MHz to 15 MHz, such as 13.56 MHz.

After the first cycles C1 are performed, the passivation coating 120a shown in FIG. 4B is selectively formed on sidewalls of the mask layer 110a. In some embodiments, the material of the passivation coating 120 or 120a includes $C_4F_8$.

Referring to FIG. 2, FIG. 3B and FIG. 4C through 4E, a first stage etching process including the second cycles C2 is performed to anisotropically etch the semiconductor substrate 100 revealed by the mask layer 110a. Since the semiconductor substrate 100 is etched by the second cycles C2, the second cycles C2 are considered as first etching cycles. During the second cycles C2, the duration E2 of the etching step, the duration D2 of the passivating step and a second duration ratio E2/D2 of the etching step to the passivating step are constant. In some embodiments, the first duration ratio E1/D1 is less than the second duration ratio E2/D2. For example, the second duration ratio E2/D2 may range from about 1.4 to about 1.6.

As shown in FIG. 3B, during the passivating step of each second cycle C2, passivating gas (e.g. $C_4F_8$ or other suitable passivating gas) is introduced into the reactive chamber and the flowrate of the passivating gas may range from about 200 sccm to about 300 sccm (e.g., about 250 sccm). During the etching step of each second cycle C2, etching gas (e.g. $SF_6$ or other suitable etching gas) is introduced into the reactive chamber and the flowrate of the etching gas may range from about 350 sccm to about 450 sccm (e.g., about 400 sccm). In other words, the passivating gas and the etching gas are alternately introduced into the reactive chamber when performing the second cycles C2. In some embodiments, the passivating step of each second cycle C2 include a boosting B1 followed by a passivating P, wherein the duration of the boosting B1 ranges from 0.3 second to about 0.7 second (e.g., about 0.5 second), the process pressure applied to the reactive chamber during the boosting B1 ranges from about 35 Torr to about 45 Torr (e.g., about 40 Torr), the duration of the passivating P ranges from 1.5 second to 2.5 second (e.g., about 2 seconds), and the process pressure applied to the reactive chamber during the passivating P ranges from about 75 Torr to about 85 Torr (e.g., about 80 Torr).

Figure 4C:
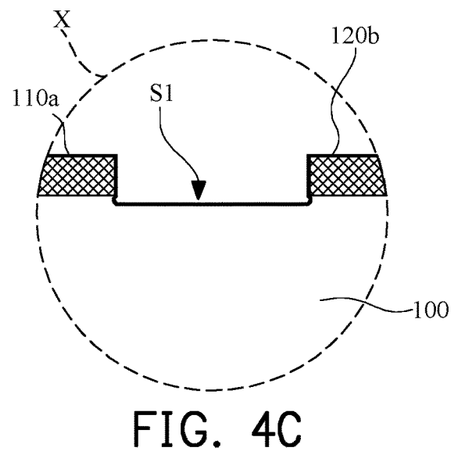
Figure 4D:
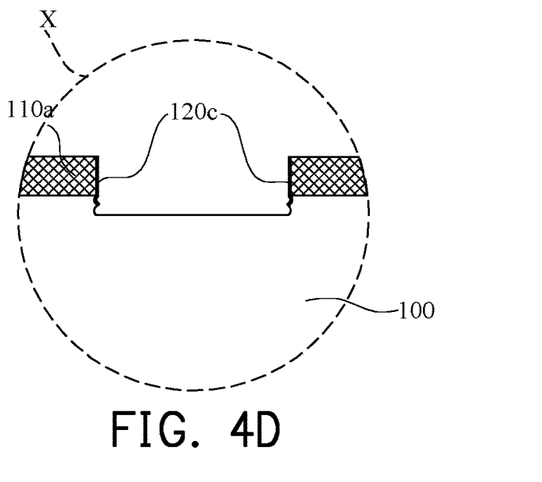

In some embodiments, the etching step of each second cycle C2 may include a boosting B2 followed by a main etching M. The duration of the boosting B2 may be constant which ranges from about 2 seconds to about 3 seconds (e.g., about 2.5 seconds), the process pressure applied to the reactive chamber during the boosting B2 may range from about 20 Torr to about 30 Torr (e.g., about 25 Torr), the duration of the main etching M may be constant which ranges from about 0.3 second to about 0.7 second (e.g., about 0.5 second), and the process pressure applied to the reactive chamber during the main etching M may range from about 75 Torr to about 85 Torr (e.g., 80 Torr). As shown in FIG. 4C and FIG. 4D, after performing the passivating step of each second cycle C2, a passivation coating 120b is conformally formed on the recess S1 of the semiconductor substrate 100 and the mask layer 110a. The boosting B2 may be used to remove portions of the passivation coating 120b that are formed on a bottom surface of the recess S1 of the semiconductor substrate 100 and the top surface of the mask layer 110a. Portions of the passivation coating 120 that are formed on the sidewalls of the recess S1 and the sidewalls of the mask layer 110a are not removed by the boosting B2. For example, during the boosting B2 of the second cycles C2, ion bombardment provided by the plasma generated in the reactive chamber is used to remove the portions of the passivation coating 120b such that a passivation coating 120c may be formed on the sidewalls the mask layer 110a and the sidewalls of the cavity 102. The main etching M of the second cycle C2 may be used to etch the semiconductor substrate 100 such that the recess S1 is deepened, as shown in FIG. 4D.

In some embodiments, during the boosting B2 of each etching step in the second cycles C2, oxygen gas ($O_2$) may be further introduced into the reactive chamber and the flowrate of the oxygen gas ranges from about 45 sccm to about 55 sccm (e.g., about 50 sccm). Furthermore, during the main etching M of each etching step in the second cycles C2, oxygen gas may be further introduced into the reactive chamber and the flowrate of the oxygen gas may range from about 0.5 sccm to about 1.5 sccm (e.g., about 1 sccm).

When performing the passivating steps of the second cycles C2, the coil RF power applied to the coil (i.e. upper electrode) of the reactive chamber ranges from about 1800 Watts to about 2200 Watts (e.g., about 2000 Watts). When performing the etching steps of the second cycles C2, the coil RF power applied to the coil of the reactive chamber ranges from about 2300 Watts to about 2700 Watts (e.g., about 2500 Watts), the platen RF power applied to the platen (i.e. lower electrode) of the reactive chamber ranges from about 100 Watts to about 150 Watts (e.g., about 125 Watts) during the boosting B2, and the platen RF power applied to the platen (i.e. lower electrode) of the reactive chamber ranges from about 15 Watts to about 25 Watts (e.g., about 20 Watts) during the main etching M. Furthermore, the platen operates at high frequency ranging from 10 MHz to 15 MHz (e.g., about 13.56 MHz).

Figure 4E:
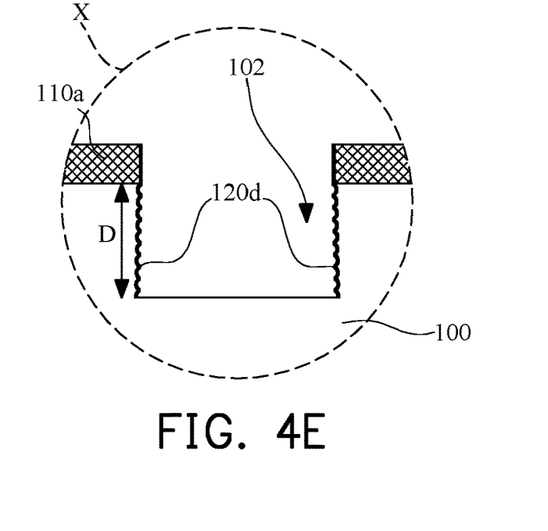

After the second cycles C2 are performed, the passivation coating 120d shown in FIG. 4E is selectively formed on the sidewalls of the mask layer 110a and the sidewalls of the cavity 102. In some embodiments, the material of the passivation coating 120a, 120b, 120c and 120d includes $C_4F_8$.

Referring to FIG. 2, FIG. 3C, FIG. 4D and FIG. 4E, after the first stage etching process including the second cycles C2 is performed, a second stage etching process including the third cycles C3 may be performed optionally to anisotropically etch the semiconductor substrate 100 and increase the roughness of the bottom surface of the cavity 102. Since the semiconductor substrate 100 is further etched by the third cycles C3, the third cycles C3 are second etching cycles. During the third cycles C3, the duration E3 of the etching step is variable and ramps up step by step, the duration D3 of the passivating step is constant, and a third duration ratio E3/D3 of the etching step to the passivating step is variable and ramps up step by step. In some embodiments, during the third cycles C3 (i.e. the second etching cycles), the duration E3 of the etching step linearly ramps up step by step, the duration D3 of the passivating step is constant, and the third duration ratio E3/D3 linearly ramps up step by step. The third duration ratio E3/D3 is variable and may ramp up step by step from X2 to Y2, wherein X2 and Y2 are greater than 1 and less than the second duration ratio. For example, the third duration ratio E3/D3 may range from about 1.2 to about 1.35.

As shown in FIG. 3C, during the passivating step of each third cycle C3, passivating gas (e.g. $C_4F_8$ or other suitable passivating gas) is introduced into the reactive chamber and the flowrate of the passivating gas ranges from about 150 sccm to about 250 sccm (e.g., about 200 sccm). During the etching step of each first cycle C1, etching gas (e.g. $SF_6$ or other suitable etching gas) is introduced into the reactive chamber and the flowrate of the etching gas may range from about 200 sccm to about 300 sccm (e.g., about 250 sccm). In other words, the passivating gas and the etching gas are alternately introduced into the reactive chamber when performing the third cycles C3. In some embodiments, the passivating step of each third cycle C3 may merely include a passivating P, wherein the duration of the passivating P may be constant which ranges from about 1.5 second to 2.5 second (e.g., about 2 seconds), the process pressure applied to the reactive chamber during the passivating P may range from about 15 Torr to about 25 Torr (e.g., about 20 Torr).

In some embodiments, during the third cycles C3, each etching step may respectively include a boosting B2 followed by a main etching M. The duration of the boosting B2 may be constant which ranges from about 0.5 second to about 1.5 second (e.g., about 1 second), the process pressure applied to the reactive chamber during the boosting B2 may range from about 10 Torr to about 20 Torr (e.g., about 15 Torr), the duration of the main etching M may be variable and linearly ramps up step by step, and the process pressure applied to the reactive chamber during the main etching M may range from about 20 Torr to about 25 Torr (e.g., about 22 Torr). For example, the duration of the main etching M linearly ramps up step by step from about 2.4 seconds to about 2.7 seconds.

When performing the passivating steps of the third cycles C3, the coil RF power applied to the coil (i.e. upper electrode) of the reactive chamber ranges from about 1600 Watts to about 2000 Watts (e.g., about 1800 Watts). When performing the etching steps of the third cycles C3, the coil RF power applied to the coil of the reactive chamber ranges from about 2300 Watts to about 2700 Watts (e.g., about 2500 Watts), the platen RF power applied to the platen (i.e. lower electrode) of the reactive chamber ranges from about 80 Watts to about 120 Watts (e.g., about 100 Watts) during the boosting B2, and the platen RF power applied to the platen (i.e. lower electrode) of the reactive chamber may linearly ramp up step by step from about 85 Watts to about 87 Watts during the main etching M. Furthermore, the platen operates at low frequency ranging from about 350 kHz to about 450 kHz (e.g., about 380 kHz). To sum up, above-mentioned the first cycles C1 and the second cycles C2 are performed under high frequency ranging from about 10 MHz to about 15 MHz (e.g., about 13.56 MHz) and the third cycles C3 are performed under low frequency which is lower than the high frequency ranging from about 350 kHz to about 450 kHz (e.g., about 380 kHz).

In the semiconductor structure shown in FIG. 1C, a plurality of cavities 102 may be formed in the semiconductor substrate 100 and depth uniformity of the cavities 102 may be enhanced by the first cycles C1 (i.e. the pre-coating cycles). Furthermore, the roughness of the bottom surface of the cavities 102 may be increased or optimized by the third cycles C3.

FIG. 5A through FIG. 5F schematically illustrate cross-sectional views of a method of fabricating a cavity substrate according to some embodiments of the present disclosure.

Figure 5A:
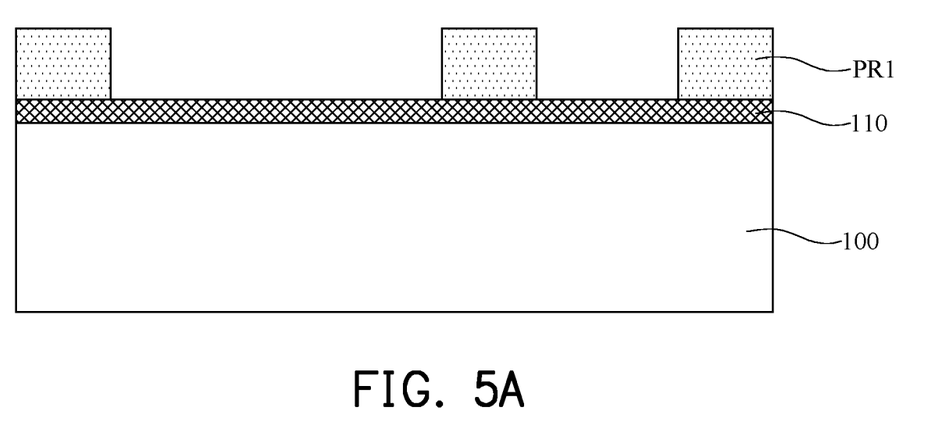
FIG. 5A through FIG. 5F schematically illustrate cross-sectional views of a method of fabricating a cavity substrate according to some embodiments of the present disclosure.

Referring to FIG. 5A, a semiconductor substrate 100 is provided and a mask material layer 110 on the semiconductor substrate 100. For example, the semiconductor substrate 100 may include a silicon substrate or substrates made of other semiconductor materials. After forming the mask material layer 110 on the semiconductor substrate 100, a photolithography process, for example, is performed such that a patterned photoresist layer PR1 is formed on the mask material layer 110. The patterned photoresist layer PR1 may include at least one or a plurality of openings for exposing or revealing the mask material layer 110 partially. In some embodiments, the mask material layer 110 may include silicon dioxide or other materials having high etching selectivity with respect to the material of the semiconductor substrate 100 (e.g. silicon).

Figure 5B:
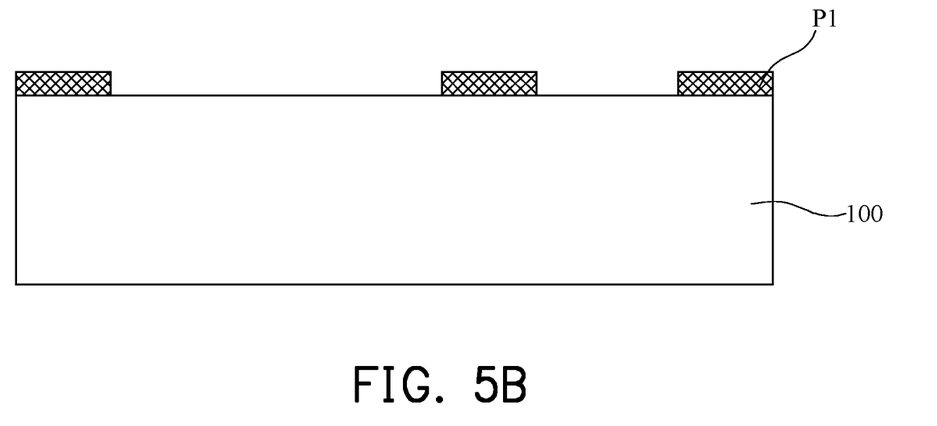

Referring to FIG. 5A and FIG. 5B, by utilizing the patterned photoresist layer PR1 as a mask, the mask material layer 110 revealed or not covered by the patterned photoresist layer PR1 may be removed until the semiconductor substrate 100 is exposed such that a first pattern P1 of a mask layer 110a is formed on the semiconductor substrate 100. In some embodiments, the mask material layer 110 may be patterned through an etching process. After forming the first pattern P1 of the mask layer 110a, the patterned photoresist layer PR1 is stripped. Since the first pattern P1 has high etching selectivity with respect to the semiconductor substrate 100, the first pattern P1 is a patterned hard mask layer.

Figure 5C:
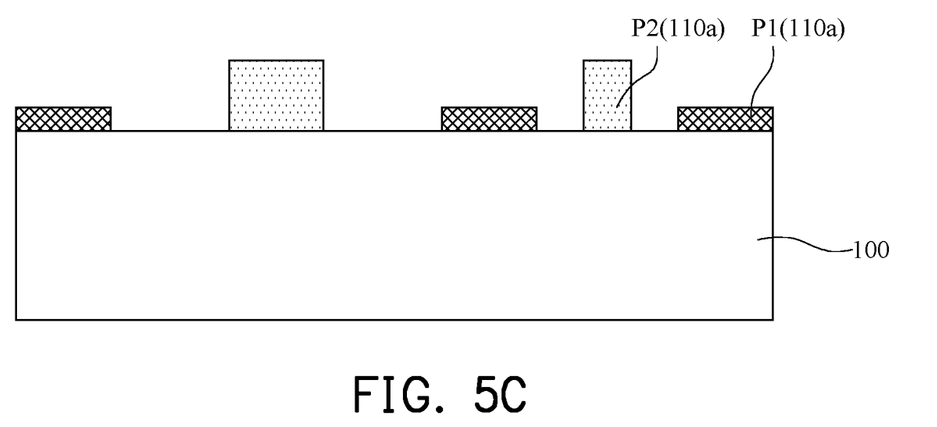

Referring to FIG. 5C, a second pattern P2 of the mask layer 110a is formed on the semiconductor substrate 100 revealed by the first pattern P1. The second pattern P2 and the first pattern P1 are not overlapped with each other. For example, the second pattern P2 may be formed on the top surface of the semiconductor substrate 100 and located in the openings defined in the first pattern P1. In some embodiments, the first pattern P1 and the second pattern P2 are made of different materials and the second pattern P2 of the mask layer 110a may be a patterned photoresist layer.

Figure 5D:
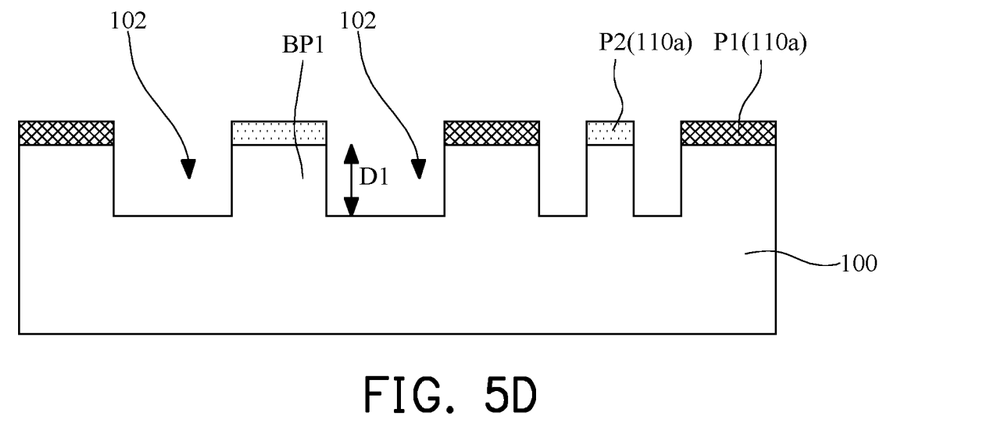

Referring to FIG. 5D, an anisotropic etching process is performed to form a first cavity 102 in the semiconductor substrate 100 and a first bump BP1 surrounded by the first cavity 102. By utilizing the mask layer 110a including the first pattern P1 and the second pattern P2 as an etching mask, the semiconductor substrate 100 revealed by the mask layer 110a is anisotropically etched until the first cavity 102 having a predetermined depth D1 and the first bump BP1 covered by the second pattern P2 of the mask layer 110a are formed. In some embodiments, the height of the first bump BP1 and the depth D1 of the first cavity 102 may range from about 9 micrometers to about 12 micrometers. However, the height of the first bump BP1 and the depth D1 of the first cavity 102 are not limited.

The afore-said anisotropic etching process for forming the first cavity 102 in the semiconductor substrate 100 includes a plurality of cycles. Recipe of the cycles for forming the first cavity 102 in the semiconductor substrate 100 is, for example, the same with that of the above-mentioned second cycles C2 (shown in FIG. 3B) of the first stage etching process. Accordingly, details of the recipe of the cycles for forming the first cavity 102 in the semiconductor substrate 100 are omitted.

Figure 5E:
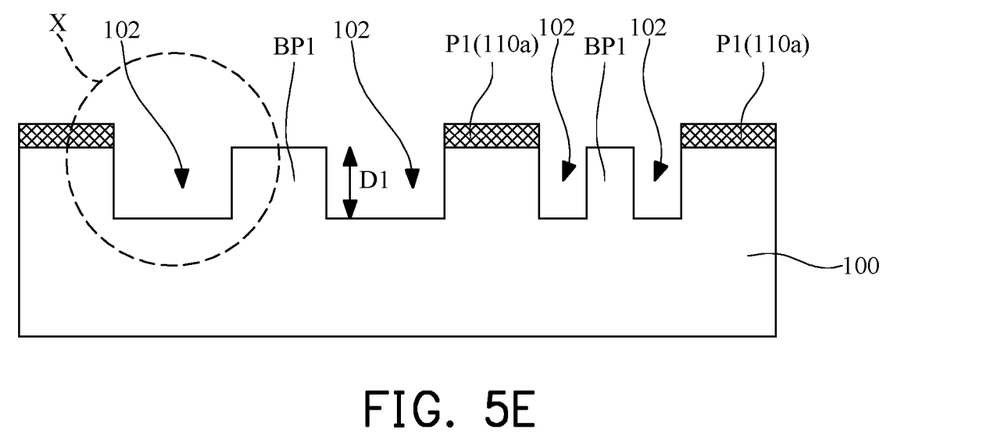

Referring to FIG. 5E, Referring to FIG. 5D, the second pattern P2 of the mask layer 110a is removed from the first bump BP1 to further reveal the top surface of the first bump BP1. In some embodiments, the second pattern P2 (e.g., the patterned photoresist layer) of the mask layer 110a may be removed or stripped by ashing or other suitable processes.

Figure 5F:
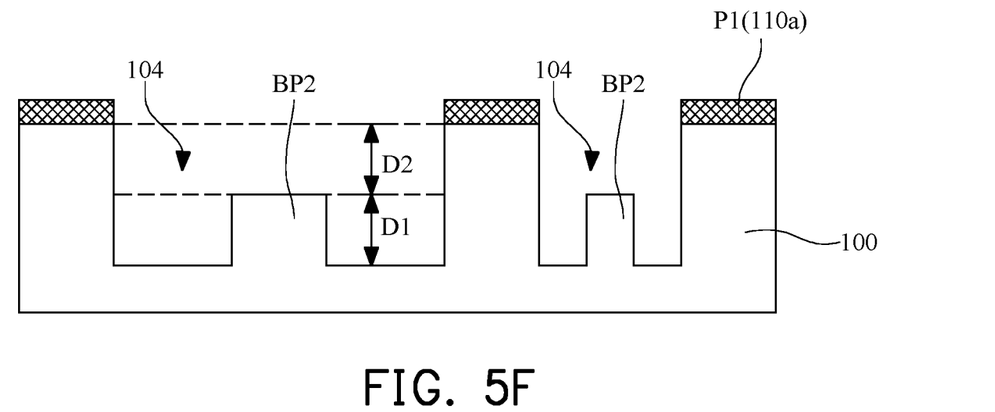

Referring to FIG. 5E and FIG. 5F, a multi-step anisotropic etching process is performed one the semiconductor substrate 100 such that the semiconductor substrate 100 revealed by the first pattern P1 of the mask layer 110a is anisotropically etched until the first cavity 102 (shown in FIG. 5E) is deepened to form a second cavity 104 and a second bump BP2 is formed in the second cavity 104. By utilizing the first pattern P1 of the mask layer 110a as an etching mask, the semiconductor substrate 100 having the first cavity 102 and the first bump BP1 is anisotropically etched until the second cavity 104 having a predetermined depth (D1+D2) and the second bump BP2 are formed. In some embodiments, the depth (D1+D2) of the second cavity 104 may range from about 15 micrometers to about 25 micrometers. However, the depth (D1+D2) of the second cavity 104 is not limited. In some embodiments, the height of the second bump BP2 and the height of the first bump BP1 (i.e. D1) may range from about 9 micrometers to about 12 micrometers.

The multi-step etching process for forming the second cavity 104 and the second bump BP2 is described in accompany with FIG. 2, FIG. 5E, FIG. 5F and FIG. 6A through FIG. 6E in detail.

FIG. 6A through FIG. 6E schematically illustrate cross-sectional view of a method of fabricating the second cavity shown in Y portion of FIG. 5E according to some embodiments of the present disclosure.

Referring to FIG. 2, FIG. 5E, FIG. 5F and FIG. 6A through FIG. 6E, the multi-step anisotropic etching process for forming the second cavity 104 and the second bump BP2 may include performing a plurality of first cycles C1 and performing a plurality of second cycles C2, and the second cycles C2 are performed repeatedly after the first cycles C1. The above-mentioned first and second cycles C1 and C2 are performed in a reactive chamber suitable for generating plasma for anisotropic etching. Each one cycle among the first cycles C1 and the second cycles C2 may respectively include a passivating step and an etching step performed after the passivating step. After performing the first cycles C1 and the second cycles C2, a passivation coating may remain on sidewalls of the second cavity 104 and sidewalls of the etched bump BP (shown in FIG. 6C through FIG. 6E), and thus a removal process R may be performed to remove the passivation coating formed on the sidewalls of the second cavity 104 and the sidewalls of the etched bump BP. For example, the first cycles C1 may be performed repeatedly n1 times and the second cycles C2 may be performed repeatedly n2 times. For example, n1 may be an integer ranging from 2 to 4; and n2 may be an integer ranging from 2 to 4. The value of n1 and n2 depends on the depth (D1+D2) of the second cavity 104.

In some alternative embodiments, the multi-step anisotropic etching process for forming the second cavity 104 and the second bump BP2 may further include a plurality of third cycles C3 performed repeatedly after the second cycles C2. The above-mentioned first, second and third cycles C1, C2 and C3 are performed in a reactive chamber suitable for generating plasma for anisotropic etching. Each one cycle among the first cycles C1, the second cycles C2 and the third cycles C3 may respectively include a passivating step and an etching step performed after the passivating step. After performing the first cycles C1, the second cycles C2 and the third cycles C3, a passivation coating may remain on sidewalls of the second cavity 104 and sidewall of the etched bump BP, and thus a removal process R may be performed to remove the passivation coating formed on the sidewalls of the second cavity 104 and the sidewall of the etched bump BP. For example, the first cycles C1 may be performed repeatedly n1 times, the second cycles C2 may be performed repeatedly n2 times, and the third cycles C3 may be performed n3 times. For example, n1 may be an integer ranging from 2 to 4; n2 may be an integer ranging from 2 to 4; and n3 may be an integer ranging from 2 to 4. The value of n1, n2 and n3 depends on the depth (D1+D2) of the second cavity 104.

Figure 6A:
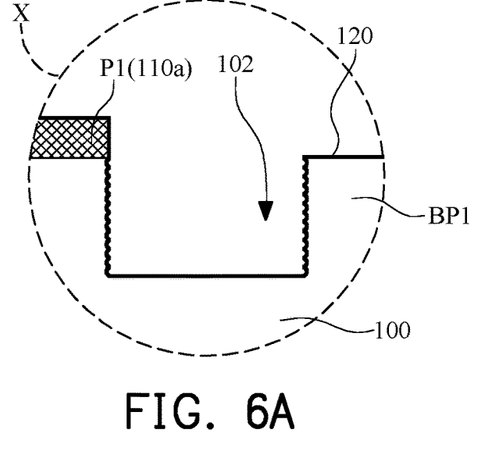
FIG. 6A through FIG. 6E schematically illustrate cross-sectional view of a method of fabricating the second cavity shown in Y portion of FIG. 5E according to some embodiments of the present disclosure.

Referring to FIG. 2, FIG. 3A and FIG. 6A, a pre-coating process is performed on the semiconductor substrate 100 and the first pattern P1 of the mask layer 110a by the first cycles C1 such that a passivation coating 120 is conformally formed on the first pattern P1, the first bump BP1 and the semiconductor substrate 100. Since the passivation coating 120 is formed by the first cycles C1, the first cycles C1 are pre-coating cycles. During the first cycles C1, the duration E1 of the etching step is variable and ramps up step by step, the duration D1 of the passivating step is variable and ramps down step by step, and a first duration ratio E1/D1 of the etching step to the passivating step is variable and ramps up step by step. In some embodiments, during the first cycles C1 (i.e. the pre-coating cycles), the duration E1 of the etching step linearly ramps up step by step, the duration D1 of the passivating step linearly ramps down step by step, and the first duration ratio E1/D1 non-linearly ramps up step by step. The first duration ratio E1/D1 is variable and may ramp up step by step from X1 to Y1, wherein X1 is less than 1 (e.g. about 0.4), and Y1 is greater than 1 and less than 1.5.

As shown in FIG. 3A, during the passivating step of each first cycle C1, passivating gas (e.g. $C_4F_8$) is introduced into the reactive chamber and the flowrate of the passivating gas may range from about 200 sccm to about 300 sccm (e.g., about 250 sccm). During the etching step of each first cycle C1, etching gas (e.g. $SF_6$) is introduced into the reactive chamber and the flowrate of the etching gas may range from about 350 sccm to about 450 sccm (e.g., about 400 sccm). In other words, the passivating gas and the etching gas are alternately introduced into the reactive chamber when performing the first cycles C1. In some embodiments, the passivating step of each first cycle C1 may include a boosting B1 followed by a passivating P, wherein the duration of the boosting B1 may range from about 0.3 second to about 0.7 second (e.g., about 0.5 second), the process pressure applied to the reactive chamber during the boosting B1 may range from about 35 Torr to about 45 Torr (e.g., about 40 Torr), the duration of the passivating P linearly ramps down step by step from about 5 seconds to about 2 seconds, and the process pressure applied to the reactive chamber during the passivating P may range from about 75 Torr to about 85 Torr (e.g., about 80 Torr).

In some embodiments, during the foremost cycles (e.g., the first three cycles) among the first cycles C1, each etching step may respectively include a boosting B2 only, and the duration of the boosting B2 may be variable and may ramp up from about 2 seconds to about 2.5 seconds step by step. The boosting B2 may be used to at least partially remove portions of the passivation coating 120 that are formed on top surfaces of the semiconductor substrate 100 and the first pattern P1, and portions of the passivation coating 120 formed on sidewalls the first pattern P1 are not removed by the boosting B2. For example, during the boosting B2 of the first cycles C1, ion bombardment provided by the plasma generated in the reactive chamber is used to remove the portions of the passivation coating 120 formed on top surfaces of the semiconductor substrate 100 and the first pattern P1. The portions of the passivation coating 120 formed on sidewalls the first pattern P1 are not removed by ion bombardment provided by the plasma. After performing the foremost steps (e.g., the first three steps) among the first cycles C1, the semiconductor substrate 100 and the first bump BP1 may not be etched due to the protection of the pre-coating (i.e. the passivation coating 120).

Figure 6B:
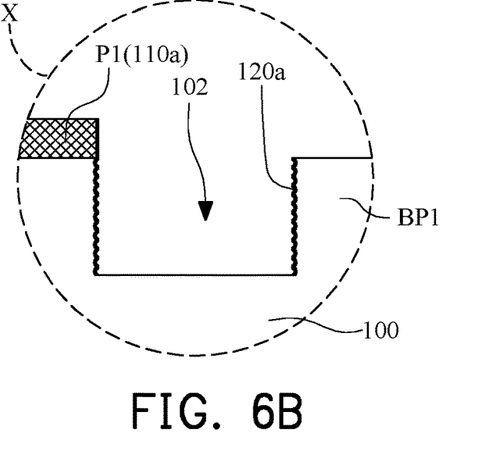
Figure 6C:
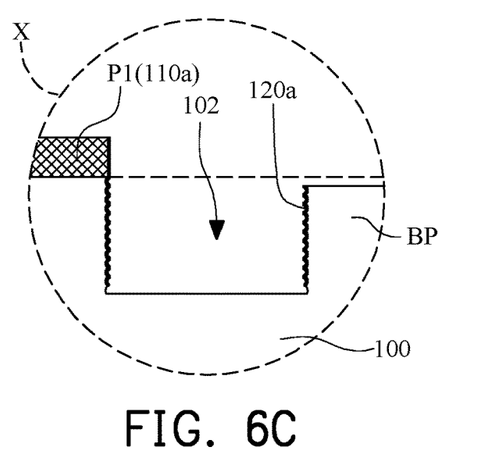

Referring to FIG. 3A, FIG. 6B and FIG. 6C, during the rest steps (e.g., the fourth and the fifth steps) among the first cycles C1, each etching step may respectively include a boosting B2 followed by a main etching M. The duration of the boosting B2 may be constant which ranges from about 2 seconds to about 3 seconds (e.g., about 2.5 seconds), the process pressure applied to the reactive chamber during the boosting B2 may range about 20 Torr to about 30 Torr (e.g., about 25 Torr), the duration of the main etching M may be variable and linearly ramps up step by step, and the process pressure applied to the reactive chamber during the main etching M may range from about 75 Torr to about 85 Torr (e.g., about 80 Torr). As shown in FIG. 3A, after performing the rest steps (e.g., the fourth and the fifth steps) among the first cycles C1, the portions of the passivation coating 120 formed on top surfaces of the semiconductor substrate 100 and the first pattern P1 may be removed and a passivation coating 120a is formed the on sidewalls the first pattern P1 and the sidewalls of the first bump BP1. As shown in FIG. 6C, after performing the rest steps (e.g., the fourth and the fifth steps) among the first cycles C1, the semiconductor substrate 100 and the first bump BP1 may be slightly etched to as to form an etched bump BP, wherein the top surface of the etched bump BP is lower than the bottom surface of the first pattern P1.

In some embodiments, during the boosting B2 of each etching step in the first cycles C1, oxygen gas ($O_2$) may be further introduced into the reactive chamber and the flowrate of the oxygen gas may range from about 45 sccm to about 55 sccm (e.g., about 50 sccm). Furthermore, during the main etching M of each etching step in the first cycles C1, oxygen gas may be further introduced into the reactive chamber and the flowrate of the oxygen gas may range from about 0.5 sccm to about 1.5 sccm (e.g., about 1 sccm).

When performing the passivating steps of the first cycles C1, the coil radio frequency (RF) power applied to the coil (i.e. upper electrode) of the reactive chamber ranges from about 1800 Watts to about 2200 Watts (e.g., about 2000 Watts). When performing the etching steps of the first cycles C1, the coil RF power applied to the coil of the reactive chamber ranges from about 2300 Watts to about 2700 Watts (e.g., about 2500 Watts), the platen RF power applied to the platen (i.e. lower electrode) of the reactive chamber ranges from about 100 Watts to about 150 Watts (e.g., about 125 Watts) during the boosting B2, and the platen RF power applied to the platen (i.e. lower electrode) of the reactive chamber ranges from about 15 Watts to about 25 Watts (e.g., about 20 Watts) during the main etching M. Furthermore, the platen operates at high frequency ranging from 10 MHz to 15 MHz (e.g., about 13.56 MHz).

After the first cycles C1 are performed, the passivation coating 120a shown in FIG. 6B is selectively formed on sidewalls of the first pattern P1. In some embodiments, the material of the passivation coating 120 or 120a may include $C_4F_8$.

Referring to FIG. 2, FIG. 3B and FIG. 6D through 6E, a first stage etching process including the second cycles C2 is performed to anisotropically etch the semiconductor substrate 100 and the etched bump BP revealed by the first pattern P1. Since the semiconductor substrate 100 and the etched bump BP is etched by the second cycles C2, the second cycles C2 are first etching cycles. During the second cycles C2, the duration E2 of the etching step, the duration D2 of the passivating step and a second duration ratio E2/D2 of the etching step to the passivating step are constant. In some embodiments, the first duration ratio E1/D1 is less than the second duration ratio E2/D2. For example, the second duration ratio E2/D2 may range from about 1.4 to about 1.6.

As shown in FIG. 3B, during the passivating step of each second cycle C2, passivating gas (e.g. $C_4F_8$) is introduced into the reactive chamber and the flowrate of the passivating gas may range from about 200 sccm to about 300 sccm (e.g., about 250 sccm). During the etching step of each second cycle C2, etching gas (e.g. $SF_6$) is introduced into the reactive chamber and the flowrate of the etching gas may range from about 350 sccm to about 450 sccm (e.g., about 400 sccm). In other words, the passivating gas and the etching gas are alternately introduced into the reactive chamber when performing the second cycles C2. In some embodiments, the passivating step of each second cycle C2 may include a boosting B1 followed by a passivating P, wherein the duration of the boosting B1 may range from 0.3 second to about 0.7 second (e.g., about 0.5 second), the process pressure applied to the reactive chamber during the boosting B1 may range from about 35 Torr to about 45 Torr (e.g., about 40 Torr), the duration of the passivating P ranges from 1.5 second to 2.5 second (e.g., about 2 seconds), and the process pressure applied to the reactive chamber during the passivating P may range from about 75 Torr to about 85 Torr (e.g., about 80 Torr).

In some embodiments, the etching step of each second cycle C2 may include a boosting B2 followed by a main etching M. The duration of the boosting B2 may be constant which ranges from about 2 seconds to about 3 seconds (e.g., about 2.5 seconds), the process pressure applied to the reactive chamber during the boosting B2 may range from about 20 Torr to about 30 Torr (e.g., about 25 Torr), the duration of the main etching M may be constant which ranges from about 0.3 second to about 0.7 second (e.g., about 0.5 second), and the process pressure applied to the reactive chamber during the main etching M may range from about 75 Torr to about 85 Torr (e.g., about 80 Torr).

Figure 6D:
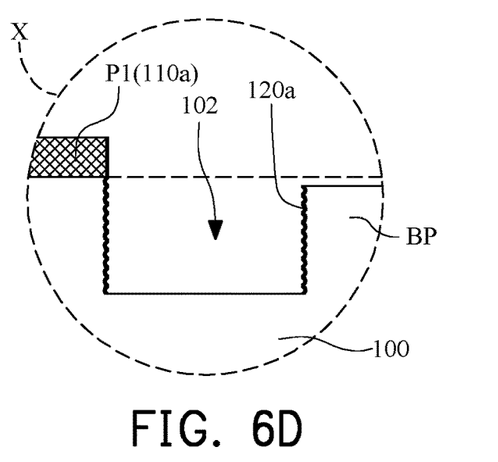

The boosting B2 may be used to remove portions of the passivation coating 120b that are formed on a bottom surface of the first cavity 102 of the semiconductor substrate 100 and the top surface of the first pattern P1. Portions of the passivation coating 120 that are formed on the sidewalls of the first cavity 102, the sidewalls of the etched bump BP and the sidewalls of the first pattern P1 are not removed by the boosting B2. For example, during the boosting B2 of the second cycles C2, ion bombardment provided by the plasma generated in the reactive chamber is used to remove the portions of the passivation coating 120b such that the passivation coating 120b is formed on the sidewalls the first pattern P1, the sidewall of the etch bump BP and the sidewalls of the etched bump BP. The main etching M of the second cycle C2 may be used to etch the semiconductor substrate 100 such that the first cavity 102 is deepened, as shown in FIG. 6D.

In some embodiments, during the boosting B2 of each etching step in the second cycles C2, oxygen gas ($O_2$) may be further introduced into the reactive chamber and the flowrate of the oxygen gas may range from about 45 sccm to about 55 sccm (e.g., about 50 sccm). Furthermore, during the main etching M of each etching step in the second cycles C2, oxygen gas may be further introduced into the reactive chamber and the flowrate of the oxygen gas may range from about 0.5 sccm to about 1.5 sccm (e.g., about 1 sccm).

When performing the passivating steps of the second cycles C2, the coil RF power applied to the coil (i.e. upper electrode) of the reactive chamber ranges from about 1800 Watts to about 2200 Watts (e.g., about 2000 Watts). When performing the etching steps of the second cycles C2, the coil RF power applied to the coil of the reactive chamber ranges from about 2300 Watts to about 2700 Watts (e.g., about 2500 Watts), the platen RF power applied to the platen (i.e. lower electrode) of the reactive chamber ranges from about 100 Watts to about 150 Watts (e.g., about 125 Watts) during the boosting B2, and the platen RF power applied to the platen (i.e. lower electrode) of the reactive chamber ranges from about 15 Watts to about 25 Watts (e.g., about 20 Watts) during the main etching M. Furthermore, the platen operates at high frequency ranging from 10 MHz to 15 MHz (e.g., about 13.56 MHz).

Figure 6E:
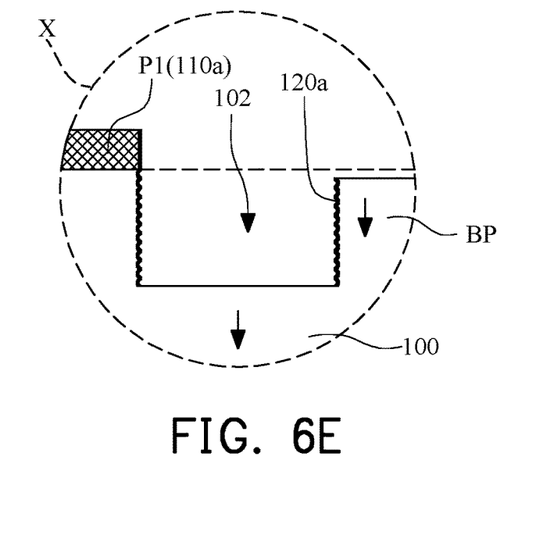

After the second cycles C2 are performed, the passivation coating 120b shown in FIG. 6E is selectively formed on the sidewalls of the first pattern, the sidewalls of the etched bump BP and the sidewalls of the first cavity 102. In some embodiments, the material of the passivation coating 120a and 120b may include $C_4F_8$.

Referring to FIG. 2, FIG. 3C, FIG. 5F, FIG. 6D and FIG. 6E, after the first stage etching process including the second cycles C2 is performed, a second stage etching process including the third cycles C3 may be performed optionally to anisotropically etch the semiconductor substrate 100 and the etched bump BP and increase the roughness of the bottom surface of the second cavity 104 (shown in FIG. 5F). Since the semiconductor substrate 100 and the etched bump BP is further etched by the third cycles C3, the third cycles C3 are second etching cycles. During the third cycles C3, the duration E3 of the etching step is variable and ramps up step by step, the duration D3 of the passivating step is constant, and a third duration ratio E3/D3 of the etching step to the passivating step is variable and ramps up step by step. In some embodiments, during the third cycles C3 (i.e. the second etching cycles), the duration E3 of the etching step linearly ramps up step by step, and the third duration ratio E3/D3 linearly ramps up step by step. The third duration ratio E3/D3 is variable and may ramp up step by step from X2 to Y2, wherein X2 and Y2 are greater than 1 and less than the second duration ratio. For example, the third duration ratio E3/D3 may range from about 1.2; to about 1.35.

As shown in FIG. 3C, during the passivating step of each third cycle C3, passivating gas (e.g. $C_4F_8$) is introduced into the reactive chamber and the flowrate of the passivating gas ranges from about 150 sccm to about 250 sccm (e.g., about 200 sccm). During the etching step of each first cycle C1, etching gas (e.g. $SF_6$) is introduced into the reactive chamber and the flowrate of the passivating gas may range from about 200 sccm to about 300 sccm (e.g., about 250 sccm). In other words, the passivating gas and the etching gas are alternately introduced into the reactive chamber when performing the third cycles C3. In some embodiments, the passivating step of each third cycle C3 may merely include a passivating P, wherein the duration of the passivating P may be constant which ranges from about 1.5 second to 2.5 second (e.g., about 2 seconds), the process pressure applied to the reactive chamber during the passivating P may range from about 15 Torr to about 25 Torr (e.g., about 20 Torr).

In some embodiments, during the third cycles C3, each etching step may respectively include a boosting B2 followed by a main etching M. The duration of the boosting B2 may be constant which ranges from about 0.5 second to about 1.5 second (e.g., about 1 second), the process pressure applied to the reactive chamber during the boosting B2 may range from about 10 Torr to about 20 Torr (e.g., about 15 Torr), the duration of the main etching M may be variable and linearly ramps up step by step, and the process pressure applied to the reactive chamber during the main etching M may range from about 20 Torr to about 25 Torr (e.g., about 22 Torr). For example, the duration of the main etching M may linearly ramp up step by step from about 2.4 seconds to about 2.7 seconds. When performing the passivating steps of the third cycles C3, the coil RF power applied to the coil (i.e. upper electrode) of the reactive chamber ranges from about 1600 Watts to about 2000 Watts (e.g., about 1800 Watts). When performing the etching steps of the third cycles C3, the coil RF power applied to the coil of the reactive chamber ranges from about 2300 Watts to about 2700 Watts (e.g., about 2500 Watts), the platen RF power applied to the platen (i.e. lower electrode) of the reactive chamber ranges from about 80 Watts to about 120 Watts (e.g., about 100 Watts) during the boosting B2, and the platen RF power applied to the platen (i.e. lower electrode) of the reactive chamber may linearly ramp up step by step from about 85 Watts to about 87 Watts during the main etching M. Furthermore, the platen operates at low frequency ranging from about 350 kHz to about 450 kHz (e.g., about 380 kHz). To sum up, abovementioned the first cycles C1 and the second cycles C2 are performed under high frequency ranging from about 10 MHz to about 15 MHz (e.g., about 13.56 MHz) and the third cycles C3 are performed under low frequency which is lower than the high frequency ranging from about 350 kHz to about 450 kHz (e.g., about 380 kHz).

In the cavity substrate shown in FIG. 5F, the cavity a plurality of second cavities 104 may be formed in the semiconductor substrate 100 and depth uniformity of the second cavities 104 and the profile of the second bumps BP2 may be enhanced by the first cycles C1 (i.e. the pre-coating cycles) and the second cycles C2. Furthermore, the roughness of the bottom surface of the second cavities 104 may be increased or optimized by the third cycles C3.

Figure 7A:
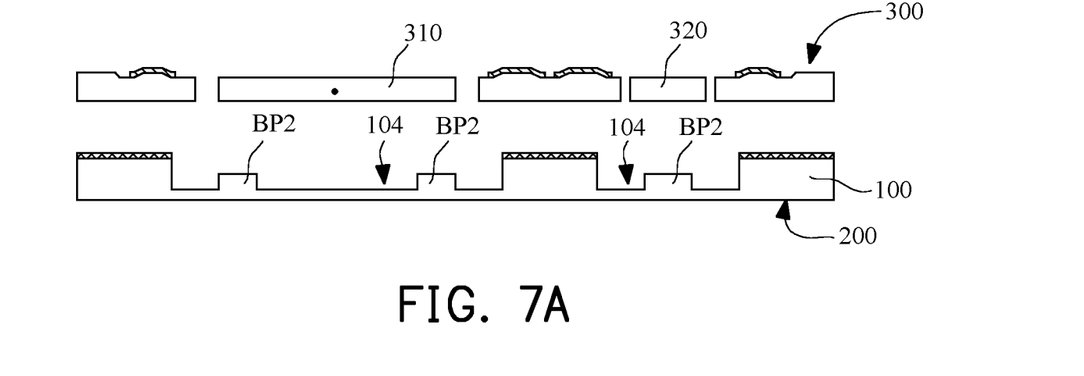
FIG. 7A through FIG. 7C schematically illustrate cross-sectional views of a method of fabricating a microelectromechanical system (MEMS) device including a cavity substrate, a MEMS substrate and a control circuit.
Figure 7B:
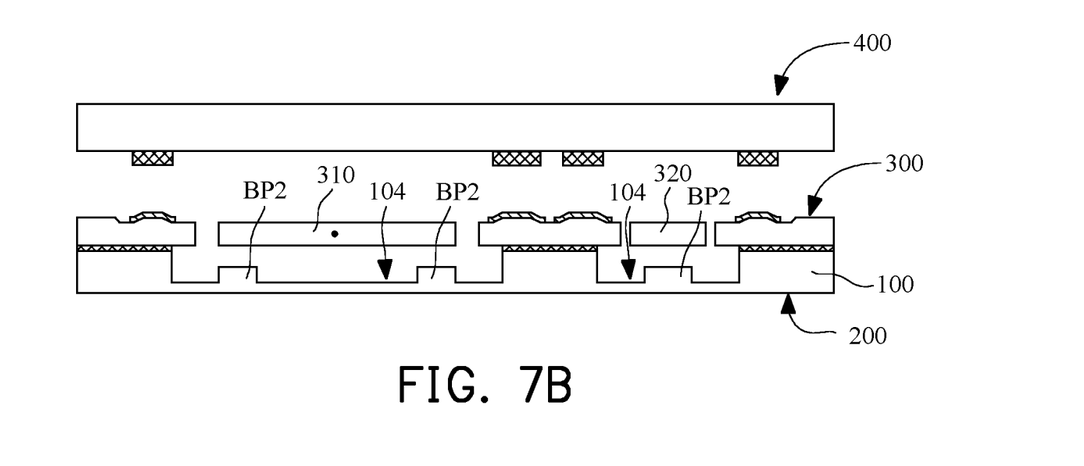
Figure 7C:
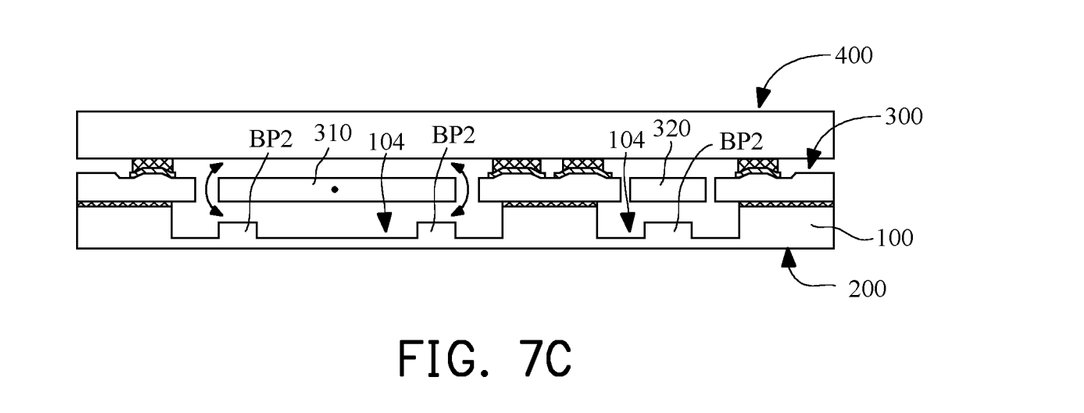

FIG. 7A through FIG. 7C schematically illustrate cross-sectional views of a method of fabricating a microelectromechanical system (MEMS) device including a cavity substrate, a MEMS substrate and a control circuit.

Referring to FIG. 7A, a cavity substrate 200 and a MEMS substrate 300 including at least one or a plurality of moving parts 310 and 320 are provided. The cavity substrate 200 is formed by the process illustrated in FIG. 5A through FIG. 5F. The cavity substrate 200 includes a substrate 100 having cavities 104 and bumps BP2, the moving parts 310 and 320 are movable with respect to the MEMS substrate 300. In some embodiments, the moving parts 310 and 320 may be a part of an accelerometer or a gyrometer, for example. Referring to FIG. 7B, the MEMS substrate 300 is bonded to the cavity substrate 200. In some embodiments, the cavity substrate 200 and the MEMS substrate 300 are, for example, formed in wafer form, and the cavity substrate 200 and the MEMS substrate 300 may be bonded to each other through wafer level bonding process. After the cavity substrate 200 and the MEMS substrate 300 are bonded, a control circuit 400 is provided. For example, the control circuit 400 is formed in wafer form.

Referring to FIG. 7C, the control circuit 400 is bonded to the MEMS substrate 300 so as to electrically connected to the MEMS substrate 300. After the control circuit 400 is bonded and electrically connected to the MEMS substrate 300, the MEMS device is accomplished essentially. As shown in FIG. 7C, the MEMS substrate 300 is sandwiched between the cavity substrate 200 and the control circuit 400. In some embodiments, the cavity substrate 200, the MEMS substrate 300 and the control circuit 400 are, for example, all formed in wafer form and the cavity substrate 200, the MEMS substrate 300 and the control circuit 400 may be bonded to one another through wafer level bonding process.

In the MEMS device, when the moving parts 310 and 320 move into the cavities 104 of the cavity substrate 200, the movement of the moving parts 310 and 320 may be constrained or stop by the bumps BP2 of the cavity substrate 200. Accordingly, the moving parts 310 and 320 function as stoppers for the moving parts 310 and 320. In the MEMS device, the depth uniformity of the cavities 104 and the profile of the bumps BP2 may be enhanced by the first cycles C1 (i.e. the pre-coating cycles) and the second cycles C2. Furthermore, since the roughness of the bottom of the cavities 102 may be increased by the third cycles (C3), van der Waals' force generated between the bumps BP2 and the moving parts 310 and 320 may be minimized. Accordingly, stiction of the moving parts 310 and 320 may be improved or prevented.

In accordance with some embodiments of the disclosure, a method of fabricating a semiconductor structure including the following steps is provided. A mask layer is formed on a semiconductor substrate. The semiconductor substrate revealed by the mask layer is anisotropically etched until a cavity is formed in the semiconductor substrate, wherein anisotropically etching the semiconductor substrate revealed by the mask layer includes performing a plurality of first cycles and performing a plurality of second cycles after performing the first cycles, each cycle among the first and second cycles respectively includes performing a passivating step and performing an etching step after performing the passivating step. During the first cycles, a first duration ratio of the etching step to the passivating step is variable and ramps up step by step. During the second cycles, a second duration ratio of the etching step to the passivating step is constant, and the first duration ratio is less than the second duration ratio.

In accordance with some embodiments of the disclosure, a method of fabricating a semiconductor structure including the following steps is provided. A mask layer is formed on a semiconductor substrate, wherein the mask layer includes a first pattern and a second pattern. The semiconductor substrate revealed by the mask layer is anisotropically etched until a first cavity and a first bump covered by the second pattern are formed. The second pattern of the mask layer is removed from the first bump. The semiconductor substrate revealed by the first pattern of the mask layer is anisotropically etched until the first cavity is deepened to form a second cavity and a second bump is formed in the second cavity, wherein anisotropically etching the semiconductor substrate revealed by the first pattern of the mask layer includes performing a plurality of first cycles and performing a plurality of second cycles after performing the first cycles, each cycle among the first and second cycles respectively includes performing a passivating step and performing an etching step after performing the passivating step. During the first cycles, a first duration ratio of the etching step to the passivating step is variable and ramps up step by step. During the second cycles, a second duration ratio of the etching step to the passivating step is constant, and the first duration ratio is less than the second duration ratio.

In accordance with some embodiments of the disclosure, a method of fabricating a semiconductor structure including the following steps is provided. A mask layer is formed on a semiconductor substrate, wherein the mask layer includes a first pattern and a second pattern. The semiconductor substrate revealed by the mask layer is anisotropically etched until a first cavity and a first bump covered by the second pattern are formed. The second pattern of the mask layer is removed from the first bump. The semiconductor substrate revealed by the first pattern of the mask layer is anisotropically etched until the first cavity is deepened to form a second cavity and a second bump is formed in the second cavity, wherein anisotropically etching the semiconductor substrate revealed by the first pattern of the mask layer includes a plurality of pre-coating cycles, a plurality of first etching cycles performed after the pre-coating cycles and a plurality of second etching cycles performed after the first etching cycles, each cycle among the pre-coating cycles, the first etching cycles and the second etching cycles respectively includes a passivating step and an etching step performed after the passivating step. During the pre-coating cycles, duration of the etching step is variable and ramps up step by step, duration of the passivating step is variable and ramps down step by step, and a first duration ratio of the etching step to the passivating step is variable and ramps up step by step. During the first etching cycles, duration of the etching step and duration of the passivating step and a second duration ratio of the etching step to the passivating step are constant. During the second etching cycles, duration of the etching step is variable and ramps up step by step, duration of the passivating step is constant, and a third duration ratio of the etching step to the passivating step is variable and ramps up step by step. The second duration ratio is greater than the first duration ratio and the third duration ratio.

In accordance with some embodiments of the disclosure, a method of fabricating a semiconductor structure including the following steps is provided. A mask layer is formed on a semiconductor substrate, wherein the mask layer includes a first pattern and a second pattern. The semiconductor substrate revealed by the mask layer is anisotropically etched until a first cavity and a first bump covered by the second pattern are formed. The second pattern of the mask layer is removed from the first bump. The semiconductor substrate revealed by the first pattern of the mask layer is anisotropically etched until the first cavity is deepened to form a second cavity and a second bump is formed in the second cavity, wherein anisotropically etching the semiconductor substrate revealed by the first pattern of the mask layer includes a plurality of pre-coating cycles, a plurality of first etching cycles performed after the pre-coating cycles and a plurality of second etching cycles performed after the first etching cycles, each cycle among the pre-coating cycles, the first etching cycles and the second etching cycles respectively includes a passivating step and an etching step performed after the passivating step. During the pre-coating cycles, a first duration ratio of the etching step to the passivating step is variable and ramps up step by step. During foremost cycles among the pre-coating cycles, each etching step respectively includes a boosting for partially removing a passivation coating formed by the passivating step; and during the rest cycles among the pre-coating cycles, each etching step respectively includes a boosting followed by a main etching. During the first etching cycles, a second duration ratio of the etching step to the passivating step are constant. During the second etching cycles, a third duration ratio of the etching step to the passivating step is variable and ramps up step by step. The second duration ratio is greater than the first duration ratio and the third duration ratio.

In accordance with some embodiments of the disclosure, a method of fabricating a semiconductor structure including forming a cavity substrate; providing a microelectromechanical system (MEMS) substrate including a moving part; bonding the MEMS substrate to the cavity substrate; and electrically connecting the MEMS substrate bonded to the cavity substrate with a control circuit is provided. The cavity substrate is formed by the following steps. A mask layer including a first pattern and a second pattern is formed on a semiconductor substrate. The semiconductor substrate revealed by the mask layer is anisotropically etched until a first cavity and a first bump covered by the second pattern are formed. The second pattern of the mask layer is removed from the first bump. The semiconductor substrate revealed by the first pattern of the mask layer is anisotropically etched until the first cavity is deepened to form a second cavity and a second bump is formed in the second cavity, wherein anisotropically etching the semiconductor substrate revealed by the first pattern includes performing a plurality of first cycles and performing a plurality of second cycles after performing the first cycles, each cycle among the first and second cycles respectively includes performing a passivating step and performing an etching step after performing the passivating step. During the first cycles, a first duration ratio of the etching step to the passivating step is variable and ramps up step by step. During the second cycles, a second duration ratio of the etching step to the passivating step is constant, and the first duration ratio is less than the second duration ratio. The movement of the moving part is constrained by the second bump formed in the second cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
anisotropically etching a semiconductor substrate comprising:
performing first cycles followed by second cycles, each cycle among the first and second cycles respectively comprising a passivating step followed by an etching step,
during the first cycles, a first duration ratio of the etching step to the passivating step ramps up step by step,
during the second cycles, a second duration ratio of the etching step to the passivating step is constant.

2. The method according to claim 1, wherein the first duration ratio non-linearly ramps up step by step, and the second duration ratio is greater than the first duration ratio.

3. The method according to claim 1, wherein the first duration ratio ramps up step by step from X1 to Y1, X1 is less than 1, and Y1 is greater than 1 and less than the second duration ratio.

4. The method according to claim 1, wherein anisotropically etching the semiconductor substrate further comprises performing third cycles after performing the second cycles, each cycle among the third cycles respectively comprises a passivating step followed by an etching step,
during the third cycles, a third duration ratio of the etching step to the passivating step ramps up step by step.

5. The method according to claim 4, wherein the third duration ratio linearly ramps up step by step.

6. The method according to claim 4, wherein the third duration ratio ramps up step by step from X2 to Y2, and X2 and Y2 are greater than 1 and less than the second duration ratio.

7. The method according to claim 4, wherein the first cycles and the second cycles are performed when a platen operates at a first frequency, and the third cycles are performed when a platen operates at a second frequency lower than the first frequency.

8. A method, comprising:
forming a mask layer on a semiconductor substrate;
anisotropically etching the semiconductor substrate revealed by the mask layer to form a first cavity and a first bump in the first cavity;
removing portions of the mask layer, the portions of the mask layer covering the first bump; and
after removing the portions of the mask layer, anisotropically etching the semiconductor substrate until the first cavity is deepened to form a second cavity and a second bump is formed in the second cavity, wherein the first cavity is deepened by performing cycles each comprising a passivating step followed by an etching step,
during a first number of the cycles, a first duration ratio of the etching step to the passivating step ramps up step by step,
during a second number of the cycles, a second duration ratio of the etching step to the passivating step is constant.

9. The method according to claim 8, wherein forming the mask layer on the semiconductor substrate comprises:
forming a patterned hard mask layer on the semiconductor substrate; and
forming a patterned photoresist layer on the semiconductor substrate revealed by the patterned hard mask layer.

10. The method according to claim 8, wherein the first duration ratio non-linearly ramps up step by step, and the second duration ratio is greater than the first duration ratio.

11. The method according to claim 8, wherein the first duration ratio ramps up step by step from X1 to Y1, X1 is less than 1, and Y1 is greater than 1 and less than the second duration ratio.

12. The method according to claim 8, wherein the first cavity is deepened by a third number of the cycles performed after performing the second number of the cycles,
during the third number of the cycles, a third duration ratio of the etching step to the passivating step ramps up step by step.

13. The method according to claim 12, wherein the third duration ratio linearly ramps up step by step.

14. The method according to claim 12, wherein the third duration ratio ramps up step by step from X2 to Y2, and X2 and Y2 are greater than 1 and less than the second duration ratio.

15. The method according to claim 12, wherein the first number of the cycles and the second number of the cycles are performed when a platen operates at a first frequency, and the third number of the cycles are performed when a platen operates at a second frequency lower than the first frequency.

16. A method, comprising:
forming a mask layer on a semiconductor substrate;
anisotropically etching the semiconductor substrate revealed by the mask layer to form a first cavity and a first bump in the first cavity;
removing portions of the mask layer, the portions of the mask layer covering the first bump; and
after removing the portions of the mask layer, anisotropically etching the semiconductor substrate until the first cavity is deepened to form a second cavity and a second bump is formed in the second cavity, wherein the first cavity is deepened by performing pre-coating cycles, first etching cycles performed after the pre-coating cycles, and second etching cycles performed after the first etching cycles, each cycle among the pre-coating cycles, the first etching cycles and the second etching cycles respectively comprises a passivating step followed by an etching step,
during the pre-coating cycles, duration of the etching step ramps up step by step, and duration of the passivating step ramps down step by step,
during the first etching cycles, duration of the etching step and duration of the passivating step are constant,
during the second etching cycles, duration of the etching step ramps up step by step and duration of the passivating step is constant.

17. The method according to claim 16, wherein
during the pre-coating cycles, duration of the etching step linearly ramps up step by step, duration of the passivating step linearly ramps down step by step, and a first duration ratio ramps up step by step,
during the first etching cycles, a second duration ratio is constant,
during the second etching cycles, duration of the etching step linearly ramps up step by step, duration of the passivating step is constant, and a third duration ratio ramps up step by step, and
wherein the second duration ratio is greater than the first duration ratio and the third duration ratio.

18. The method according to claim 17, wherein the first duration ratio ramps up step by step from X1 to Y1, X1 is less than 1, and Y1 is greater than 1 and less than the second duration ratio.

19. The method according to claim 17, wherein the third duration ratio ramps up step by step from X2 to Y2, and X2 and Y2 are greater than 1 and less than the second duration ratio.

20. The method according to claim 16, wherein the pre-coating cycles and the first etching cycles are performed when a platen operates at a first frequency, and the second etching cycles are performed when a platen operates at a second frequency lower than the first frequency.

* * * * *